United States Patent [19]

Varshney

[11] 4,272,308
[45] Jun. 9, 1981

[54] METHOD OF FORMING RECESSED ISOLATION OXIDE LAYERS

[76] Inventor: Ramesh C. Varshney, 2622 Ohlone Dr., San Jose, Calif. 95132

[21] Appl. No.: 83,346

[22] Filed: Oct. 10, 1979

[51] Int. Cl.³ .......................................... H01L 21/316
[52] U.S. Cl. .................................... 148/187; 148/1.5; 357/49; 29/576 W
[58] Field of Search ................ 148/187, 188, 189, 1.5; 357/49; 29/576 W

[56] References Cited

U.S. PATENT DOCUMENTS

| | | | |
|---|---|---|---|
| 3,761,327 | 9/1973 | Harlow et al. | 148/187 |
| 4,001,465 | 1/1977 | Graul et al. | 148/187 |
| 4,002,511 | 1/1977 | Magdo et al. | 148/187 |
| 4,151,010 | 4/1979 | Goth | 148/1.5 |

Primary Examiner—G. Ozaki
Attorney, Agent, or Firm—Harry M. Weiss

[57] ABSTRACT

A method of providing recessed oxide isolation layers employs prior art techniques to the point at which a photoetched recess has exposed the semiconductor surface in which the recessed oxide isolation layer is to be grown. The semiconductor wafer is then subjected to a nitride layer formation procedure. The nitride layer formed extends into a photoetched recess and forms a nitride layer on the side surfaces of the recess. The newly deposited nitride layer is subjected to an etching process which etches vertically only, exposing the semiconductor surface in a pattern defined by the nitride coated recess. Since the recess walls are lined with a nitride layer, subsequent oxidation growth is restricted to the recess defined by the nitride coated walls. There is no intrusion of the recessed oxide isolation layer into adjacent active areas of the semiconductor material. Thus, the full active width of adjacent areas of the semiconductor is preserved and greater utilization of the available surface area achieved.

6 Claims, 12 Drawing Figures

METHOD OF FORMING RECESSED ISOLATION OXIDE LAYERS

BACKGROUND

1. Field of the Invention

This invention generally relates to semiconductor devices or structures and fabrication methods therefor and more particularly relates to improved planar type silicon semiconductor devices or structures including fabrication processes therefor having recessed oxide regions located in the silicon.

2. Description of the Prior Art

In the past, the semiconductor device technology has developed from the fabrication of only discrete devices to the present process of making complex integrated circuits containing thousands of individual devices. In the early days of the semiconductor industry when all the devices being made were discrete devices, these discrete devices were made with semiconductor regions of either N or P type conductivity which were located in various portions of the semiconductor substrate.

Many process and resulting structural changes were developed including a process generally known in the semiconductor industry as the "planar process". In the planar process, all the semiconductor regions of either P or N type conductivity were formed or located in one planar (i.e. top) surface portion of the semiconductor (silicon) substrate rather than in various surface portions of the semiconductor substrate.

The planar process technology is utilized to a great extent in making integrated circuits. In the planar process technology all diffusions or ion implantations of P or N type conductivity are carried out using one surface of the semiconductor structure or substrate.

In one example, the starting semiconductor substrate or structure made of, for example, silicon, will generally receive at least one protective or insulating surface coating of, for example, silicon dioxide. In some other examples, two or more protective or insulating layers or surface coatings are formed using, for example, silicon dioxide and silicon nitride layers. In the use of a combined silicon dioxide-silicon nitride protective or insulating layered combination, the underlying oxide layer (in contact with the silicon surface) serves to remove surface stresses from active areas on the silicon surface which would occur if the silicon nitride layer was formed directly on the silicon surface without the underlying intermediate silicon dioxide layer.

The oxide layer may be thermally grown by exposing the silicon surface to an oxidizing atmosphere at elevated temperatures. Alternately, the oxide may be deposited by pyrolytic deposition or RF sputtering techniques. The silicon nitride, $Si_3N_4$, may be formed on the oxide surface by exposing it to an atmosphere of silane and ammonia in an RF reactor. Other silicon nitride deposition techniques may be utilized, as desired.

When it is desired to provide an active area in the silicon surface, a photoresist coating is applied to the entire top surface of the semiconductor, over the nitride layer. When exposed to ultraviolet light through a mask which defines a desired pattern and developed, there will remain areas of the nitride surface which are unprotected by the developed photoresist coating. These unprotected areas are susceptable to being etched away. When the slice is subjected to a plasma etch, the exposed nitride areas will be removed down to the oxide layer. The exposed oxide layer may be removed using a buffered HF solution. Diffusion processes or epitaxial growth techniques may now be employed to alter the characteristics of the patterned areas exposed by removal of the nitride and oxide layers. Alternatively, ion implantation can be used to form P or N type regions in the exposed semiconductor substrate.

Planar technology consists of a multiplicity of such steps as just described; each operation creating an active surface area in the semiconductor substrate following removal of remaining oxide and nitride layers. These layers are photomasked and photoetched to expose the surfaces of the semiconductor material to which diffusion and epitaxial growth techniques may be applied as required to generate an integrated circuit on the semiconductor wafer or substrate.

It frequently is required to provide a thick oxide layer in a selected portion or surface of the semiconductor. This thick oxide layer is to remain in place within said semiconductor surface so as to isolate it from other active surfaces of the semiconductor. This thick oxide layer is created by, for example, exposing patterned areas of the semiconductor wafer to oxidizing conditions. The thick oxide layer will be grown only on the exposed silicon surface since the top nitride layer remaining after the photoetching process will act as a mask to prevent thereon oxidization build up. Since the thick oxide layer used for side wall isolation is grown in the patterned recesses defined by the etching away of the nitride and oxide layers, it was expected that the thick oxide layer would have a width no greater than that of the width of the recess, which, in itself, is determined by the earlier masking and photoetching processes. In point of fact however, it was found that the thick oxide layer grown within these recesses extends sideways beyond the limits defined by the recess. This caused the thick oxide layer to extend into the active region of the semiconductor adjacent to which it was placed for isolation purposes. As a result of this extension beyond the patterned region of the semiconductor surface defined by the etched recess, there remained less of the semiconductor surface available for subsequent use. Thus, utilization of the semiconductor surface was reduced and valuable semiconductor real estate was lost.

The growth extension regions of the thick oxide layer take on a characteristic shape which has been denoted in the art as a "birdbeak". Because these "birdbeak" extensions usurp valuable area on the semiconductor surface, these extensions place undesirable limitations on the effectiveness of very large scale integration (VLSI) procedures.

Accordingly, a need existed to provide an improved semiconductor device or structure or fabrication method therefor which would eliminate the formation of "birdbeak" recessed oxide isolation (ROX) regions.

SUMMARY OF THE INVENTION

It is therefore an object of the present invention to provide an improved semiconductor structure or device and fabrication method therefor that minimizes "birdbeak" extensions of recessed oxide isolation regions.

It is another object of this invention to provide an improved semiconductor structure or device and fabrication method therefor that minimizes "birdbeak" extension of recessed oxide isolation layers into adjacent silicon areas in a silicon semiconductor substrate thereby increasing the full, useful width of such adjacent silicon areas.

It is still another object of this invention to provide an improved semiconductor structure or device and fabrication method therefor that minimizes "birdbeak" extension of recessed oxide isolation layers without the need of additional masking techniques.

The foregoing and other objects, features and advantages of this invention will be apparent from the following more particular description of the preferred embodiments of the invention as illustrated in the accompanying drawings.

DESCRIPTION OF A PREFERRED EMBODIMENT

In accordance with one embodiment of this invention, a semiconductor substrate is provided preferably of silicon. It is desired that selected areas of the silicon be isolated one from another by the formation of a recessed oxide sidewall isolation region surrounding the selected areas. Complete isolation of these selected areas is achieved by having the bottom portion of these selected areas PN junction isolated from the remaining semiconductor substrate (not shown in the drawings). Using prior art techniques, "birdbeak" extensions of these recessed oxide isolation layers would tend to intrude and reduce the width of the adjacent selected silicon or semiconductor areas. The teachings of this invention prevent such unwanted intrusion.

Conventional photolithographic masking and etching techniques are employed to the point at which photoetching has exposed the semiconductor surface in which the recessed oxide isolation layer is to be grown. However, before exposing the semiconductor surface to the oxidizing process, the wafer is subjected to a second nitride layer formation procedure which deposits an additional layer of nitride on the nitride layer already present. Further, this additional nitride layer extends into the photoetched recess. This forms a nitride layer on the side surfaces to the recess as well as on the exposed surface of the semiconductor. The newly deposited nitride layer is then subjected to an etching process which etches vertically only, for example, reactive ion etching. The result of the vertical etching process is to expose the semiconductor surface in a pattern defined by the recess, the walls of which are clad in a nitride coat. The wafer is now subjected to an oxidation process so as to cause the growth of the recessed oxide isolation layer. Since the recess walls are lined with a nitride layer, oxidation growth will be restricted to the recess defined by the nitride coated walls. With growth so restricted, there is no intrusion of the recessed oxide isolation layer into adjacent selected areas of the semiconductor material. Thus, the full active width of adjacent areas of the semiconductor is preserved and greater utilization of the available surface area achieved.

DESCRIPTION OF THE DRAWINGS

FIGS. 1-7B illustrate various steps frequently encountered in the processing of a silicon wafer to provide an integrated circuit. In brief:

FIG. 1 suggests a silicon wafer after its initial surface cleaning.

FIG. 2 illustrates the silicon wafer after an oxidizing process has deposited a protective oxide layer on the clean surface. This oxide layer will protect the surface of the silicon from surface stresses after a further deposition of a nitride layer.

FIG. 3 depicts the silicon wafer after a nitride layer has been deposited over the initial oxide layer.

FIG. 4 indicates the application of photoresist to the nitride layer in FIG. 3.

FIG. 5 illustrates the effect of exposing the photoresist to ultraviolet light through a mask to define a desired pattern, following which, the photoresist is developed to leave uncoated areas of nitride which may later be etched away.

FIG. 6 shows the effect of a plasma etch to remove the uncoated areas of nitride from the surface of the silicon.

FIG. 7B illustrates the effect of recessed oxide growth in greater detail than is available in FIG. 7A. It may be seen that the width of the recessed oxide is greater than that originally established by the area from which the nitride layer was removed. (FIG. 6.) Such growth reduces the available silicon areas on the silicon surface which may be utilized in fabricating an IC chip.

FIGS. 8-10B depict the innovative process which inhibits the lateral growth of the recessed oxide and thus contributes to increased availability of real estate on the surface of the silicon wafer.

FIG. 8 describes the effect of deposition of a second nitride layer following the etching step illustrated in FIG. 6. Note that the walls and the floor of the recesses receive a nitride coat.

FIG. 9 shows the effect of a reactive ion or planar plasma etch of the nitride layer deposited in FIG. 8. Note that the walls of the recesses remain lined with a nitride layer. Practically, the top portions of this second nitride layer are also removed, but are shown left on to emphasize the continuous nitride coating extending into the recesses.

FIG. 10B shows a portion of FIG. 10A and illustrates the effect of the nitride walls in retarding the lateral growth of the recessed oxide thereby contributing significantly to increased availability of useful, silicon surface areas on the silicon wafer.

DESCRIPTION OF THE INVENTION

As noted in the background discussion, current technology makes use of the depositions of oxide and nitride layers on semiconductor surfaces, following which, photoetching establishes a pattern of exposed semiconductor surfaces to which ion implantation, diffusion and epitaxial growth techniques may be applied. Similar processes may be used for the establishment of regions of conductivity, resistivity, and isolation, as well as the formation of active N or P type semiconductor regions.

Figure 1:
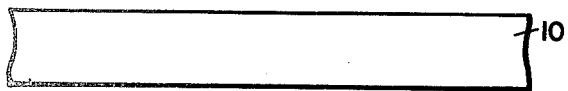
Figure 2:
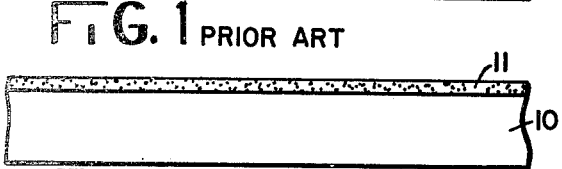
Figure 3:
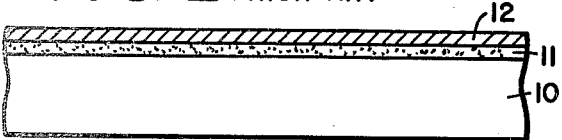
Figure 4:
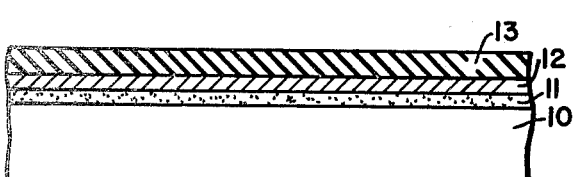

FIG. 1 suggests a cross-section of a semiconductor wafer 10, for example, silicon. The silicon wafer will be subjected to appropriate cleaning before proceeding with the deposition of oxide and nitride layers. The various layers are built up as indicated in FIGS. 2 through 4, FIG. 2 showing the deposition of an oxide layer 11, FIG. 3 indicating an overlay of nitride 12 on oxide layer 11. Oxide layer 11 is used to provide stress relief for the active area of semiconductor which is formed under the nitride.

Figure 5:
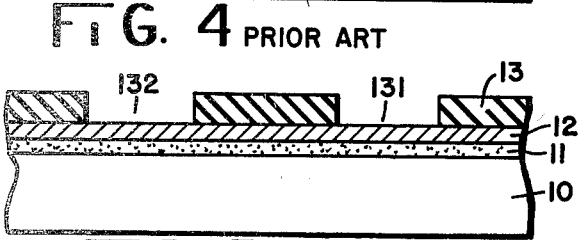

In preparation for the photoetching steps a layer of photoresist 13 (FIG. 4) is applied over nitride layer 12. When a mask, not shown, is placed over photoresist layer 13 and exposed to ultraviolet light, subsequent development will establish a pattern on the surface of the nitride layer as determined by the pattern configuration of the mask through which the photoresist is exposed. Thus, in FIG. 5, areas 131 and 132 suggest regions in which nitride layer 12 has been exposed so as to make it susceptible to subsequent removal by an etching process.

Let it be assumed that areas 131 and 132 are located above areas of the substrate portion 10 in which it is desired to place a recessed oxide isolation layer so as to sidewall isolate adjacent selected areas of the substrate 10 which have been previously established but are not indicated in the drawings.

Figure 6:
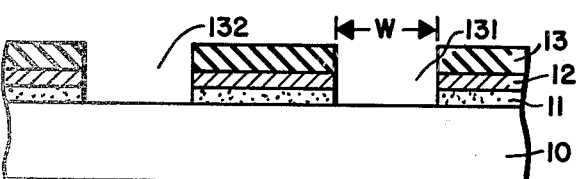

In FIG. 6, the surface area of the substrate 10 has been exposed to define the pattern of areas 131 and 132 created by removal of oxide layer 11 and nitride layer 12, using suitable etching techniques well known in the prior art. The width of pattern areas 131 and 132 may be taken as W (see also FIG. 7B). It is desired that the recessed oxide (ROX) isolation layer shall be established within the confines set by the recessed pattern areas 131 and 132.

Figure 7A:
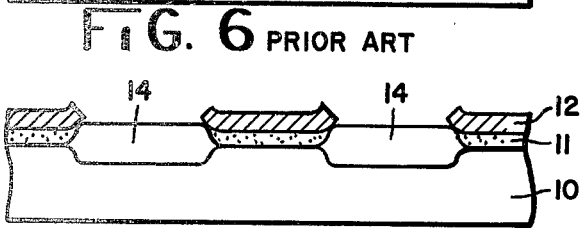
In FIG. 7A recessed oxide has been formed in the areas in which the nitride was previously etched away.

In FIG. 7A the semiconductor wafer 10 has been subjected to a thermal oxidation process which will establish the ROX isolation regions 14. The photoresist layer 13 has been removed in FIG. 7A. It may be noted that the ROX isolation regions 14 have exceeded the width W of the recessed pattern areas 131 and 132.

Figure 7B:
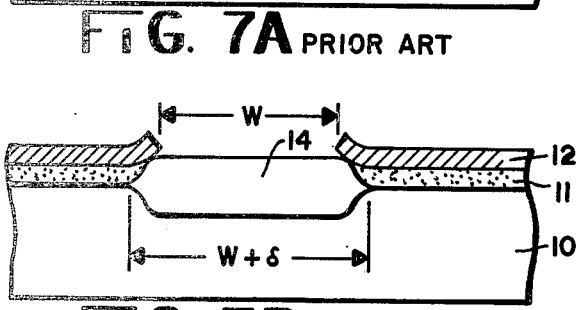
Figure 8:
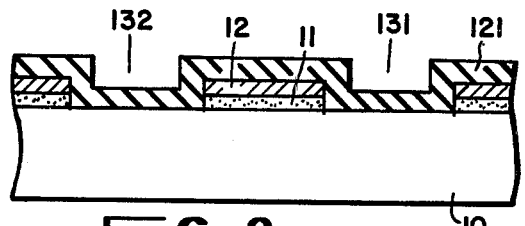

The excessive width of the ROX isolation regions 14 is indicated in greater detail in FIG. 7B. Whereas its width was meant to be established at recess dimension W, its final overall length is incrementally greater, $W+\delta$. The extended portions of the ROX isolation have the characteristic, undesired "birdbeak" shape well-known to those skilled in the art.

The extension of ROX isolation beyond the width W established by the recess pattern area 131 and 132 is believed to be due to the fact that the oxidation atmosphere intended to react with the silicon surface to produce the ROX isolation layer, also reacts with oxide layer 11 which has an original thickness sufficient to reduce stress on the active areas of the semiconductor. When the oxidizing atmosphere reacts with oxide layer 11, the ROX isolation area tends to grow outward into oxide layer 11 and beneath nitride layer 12, causing a consequent lifting of the edges of the nitride layer 12 defined by pattern areas 131 and 132.

To minimize the "birdbeak" extensions of ROX isolation into oxide layer 11, two additional steps in the production of ROX isolation layers are disclosed herein.

Beginning with the condition indicated in FIG. 6, but with photoresist 13 removed, an additional nitride layer 121 is deposited over the top surface of the wafer. Additional nitride layer 121 will thus provide a coating over existing nitride layer 12, the exposed surfaces of semiconductor 10 within pattern areas 131 and 132, and the vertical sidewalls of pattern recesses 131 and 132. Semiconductor wafer 10 is then subjected to an etching process which etches vertically only, so as not to impair the integrity of the nitride layer on the vertical sidewalls of recess pattern areas 131 and 132. Such a vertical etching might be, for example, by means of reactive ion etching. The reactive ion etch will re-expose the surface of semiconductor 10 within pattern recess areas 131 and 132. Other areas of nitride layer 121 are reduced by the etching process as well, but the integrity of the nitride layer on the vertical walls of recess pattern areas 131 and 132 will be maintained.

Figure 10A:
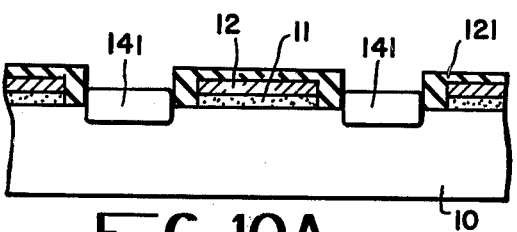
FIG. 10A illustrates the growth of recessed oxide within the bounds of the nitride walls established by the etching step of FIG. 9.

Semiconductor wafer 10 is now subjected to a thermal oxidation process to provide ROX isolation regions 141 as indicated in FIG. 10A. Nitride layer 121 on the vertical walls of pattern recesses 131 and 132 inhibit the outward extension of ROX isolation 141 into oxide layer 11 and under nitride layer 12. Thus "birdbeak" intrusions into adjacent active areas is eliminated by practice of the teachings herein.

Figure 10B:
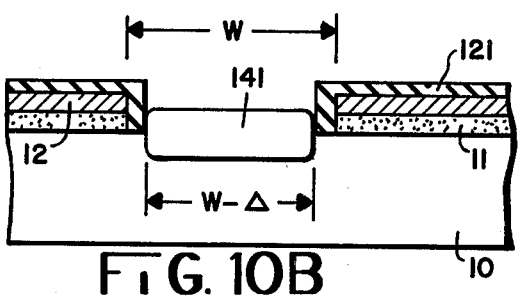

FIG. 10B indicates in greater detail the result of the inhibition of "birdbeak" extensions. ROX isolation 141 has a final width which is less than width W of pattern recess areas 131 and 132. Practice of the invention produces a ROX isolation width of $W-\Delta$. It should be noted that in the case of the prior art illustrated in FIGS. 7A and 7B, an active area of the silicon wafer between two adjacent ROX isolation areas 14 would be reduced in width by the factor $\delta$. The unwanted extension of ROX isolation 14 produced by the prior art, results in a reduction in the area of the semiconductor material which may be utilized as active areas. This puts an unwanted limitation on the ultimate benefits to be achieved by practice of very large scale integration techniques.

Practice of prior art techniques, as shown in FIGS. 7A and 7B indicate that prior art ROX isolation layers (1) are actually larger in width (by the factor $\delta$) than that of pattern recess areas 131 and 132, above ROX regions 14.

(2) inherently produce "birdbeak" extension into exposed areas of oxide layer 11, and (3) actually reduce surface area on semiconductor wafer 10 available for utilization as active areas.

As indicated in FIGS. 10A and 10B, ROX isolation regions 141 produced by following the teachings of the invention (1) are actually smaller in width by the factor $\Delta$ than that of pattern recess areas 131 and 132, (2) are inhibited in their production of "birdbeak" extensions, and (3) actually provide greater surface area availability on semiconductor wafer 10 for utilization as active areas.

While the invention has been shown and particularly described with reference to the preferred embodiments thereof, it will be understood by those skilled in the art that the foregoing and other changes in form and detail may be made therein without departing from the spirit and scope of the invention. For example, the above described process permits an increased thickness of the initial oxide 11 (see all Figures) which serves to release more stress from the semiconductor surface of the active area beneath the silicon nitride coating 12. This could not have been done previously because the thicker initial oxide caused increased "birdbeak" formation with resultant silicon nitride cracking. Thus, the above described process permits the use of an increased initial oxide layer thickness which provides release of stress, but does not produce cracking of the silicon nitride layer.

Figure 9:
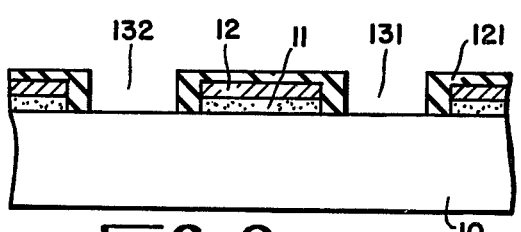

Other techniques can be employed using the above described process such as, for example, the semiconductor wafer can be etched after forming the recess gaps. This will make the surface more flat than without this etching step. Additionally, it may be desired to do an ion impurity implant or diffusion prior to formation of the ROX in order to increase the isolation characteristics of the ROX. This can be done in the above described process after forming the openings 131 and 132 shown in FIG. 9.

What is claimed is:

1. A method for growing a recessed oxide region in a portion of a semiconductor substrate located beneath an opening within a protective layer comprising the steps of:

forming an oxide-growth-inhibiting coating over said layer, on the portion of said layer defining said opening, and over the portion of said substrate beneath said opening;

simultaneously removing both said coating over the portion of said substrate beneath said opening to expose said substrate and said coating over said layer while leaving said coating on the portion of said layer defining said opening; and subjecting the said portion of said semiconductor substrate exposed through said opening to an oxidizing process selected to grow said recessed oxide region in said substrate.

2. The method of claim 1, wherein said protective layer comprises an oxide-growth-inhibiting-material located on an oxide layer.

3. The method of claim 1 or 2, wherein said removing step is an etching step that reduces the vertical thickness of said coating.

4. The method of claim 3 wherein said etching step is sputter etching.

5. A method for growing a recessed oxide region in the portion of a semiconductor substrate located beneath an opening within a protective layer which includes an oxide-growth-inhibiting layer located on an oxide layer comprising the steps of:

forming an oxide-growth-inhibiting coating over said protective layer, on the portion of said protective layer defining said opening, and over the portion of said substrate beneath said opening;

removing said protective coating in said opening to expose the portion of said substrate while leaving said oxide-growth-inhibiting coating covering the portion of said oxide layer defining said opening; and subjecting the portion of said semiconductor substrate exposed through said opening to an oxidizing process selected to grow a recessed oxide in said portion of said substrate.

6. The method of claim 5, wherein said removing step includes the step of simultaneously etching away said coating located over said portion of said substrate and over said protective layer.

* * * * *